(12) United States Patent
Lua et al.

(10) Patent No.: US 7,105,930 B2
(45) Date of Patent: Sep. 12, 2006

(54) SEMICONDUCTOR SUBSTRATES INCLUDING I/O REDISTRIBUTION USING WIRE BONDS AND ANISOTROPICALLY CONDUCTIVE FILM, METHODS OF FABRICATION AND ASSEMBLIES INCLUDING SAME

(75) Inventors: Edmund Koon Tian Lua, Singapore (SG); Nam Yin Leng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 10/634,123

(22) Filed: Aug. 4, 2003

(65) Prior Publication Data

US 2005/0017372 A1 Jan. 27, 2005

(30) Foreign Application Priority Data

Jul. 22, 2003 (SG) ............................. 200303830-4

(51) Int. Cl.
*H01L 29/40* (2006.01)
(52) U.S. Cl. ..................... 257/778; 257/738; 438/118
(58) Field of Classification Search ............... 257/738, 257/778–787
See application file for complete search history.

(56) References Cited

U.S. PATENT DOCUMENTS

| 5,554,940 | A |   | 9/1996 | Hubacher |
| 5,735,441 | A |   | 4/1998 | Fujimoto ................. 224/420 |
| 5,796,170 | A | * | 8/1998 | Marcantonio ............. 257/786 |
| 5,858,816 | A | * | 1/1999 | Sato et al. ................ 438/125 |
| 8,043,109 |   |   | 3/2000 | Yang et al. |
| 6,049,129 | A | * | 4/2000 | Yew et al. ................. 257/737 |
| 6,204,562 | B1 |  | 3/2001 | Ho et al. |
| 8,197,813 |   |   | 3/2001 | Kung et al. |
| 6,277,669 | B1 |  | 8/2001 | Kung et al. |
| 6,372,619 | B1 |  | 4/2002 | Huang et al. |
| 6,433,427 | B1 |  | 8/2002 | Wu et al. |
| 6,536,653 | B1 |  | 3/2003 | Wang et al. |
| 6,727,519 | B1 | * | 4/2004 | Wu .......................... 257/81 |
| 6,806,560 | B1 | * | 10/2004 | Kobayashi ................ 257/676 |

FOREIGN PATENT DOCUMENTS

| JP | 63-29667 | 4/1996 |
| JP | 8-113175 | 5/1996 |
| JP | 2602582 | 1/2000 |

\* cited by examiner

*Primary Examiner*—Leonardo Andújar
(74) *Attorney, Agent, or Firm*—TraskBritt

(57) ABSTRACT

Methods and apparatus for eliminating wire sweep and shorting while avoiding the use of under-bump metallization and high cost attendant to the use of conventional redistribution layers. An anisotropically conductive (z-axis) conductive layer in the form of a film or tape is applied to the active surface of a die and used as a base for conductive redistribution bumps formed on the anisotropically conductive layer, bonded to the ends of conductive columns thereof and wire bonded to the bond pads of the die. Packages so formed may be connected to substrates either with additional wire bonds extending from the conductive redistribution bumps to terminal pads or by flip-chip bonding using conductive bumps formed on the conductive redistribution bumps to connect to the terminal pads. The acts of the methods may be performed at the wafer level. Semiconductor die assemblies using the present invention are also disclosed.

20 Claims, 10 Drawing Sheets

SEMICONDUCTOR SUBSTRATES INCLUDING I/O REDISTRIBUTION USING WIRE BONDS AND ANISOTROPICALLY CONDUCTIVE FILM, METHODS OF FABRICATION AND ASSEMBLIES INCLUDING SAME

BACKGROUND OF THE INVENTION

1. Field of the Invention

The present invention relates generally to the fabrication of semiconductor dice. More particularly, the present invention pertains to methods and apparatus for redistributing bond pads on semiconductor dice to more widely pitched locations to facilitate formation of semiconductor die assemblies.

2. State of the Art

As is well known, the manufacture of semiconductor devices involves many process steps. A large number of like semiconductor devices may be fabricated on a thin wafer or other bulk substrate of semiconductive material such as silicon. Each semiconductor device comprises a chip or die of semiconductor material onto which are fabricated various electronic components such as transistors, inductors, resistors and capacitors, all operably connected to form a useful device. The wafer is then subdivided to form the discrete semiconductor devices, also known as integrated circuits (ICs). The semiconductor devices may be protectively packaged either prior to or following a singulation step, wherein the wafer is severed into individual semiconductor devices. While integrated packages may be formed of two or more chips, the integration of multiple functional circuits on single chips has also become common, leading to chips with a large number of input/output (I/O) terminals for signal transmission, power supply, ground (or bias), and testing. There has been a continuing effort in the industry to enhance the functional density of semiconductor devices while simultaneously decreasing their size. Densification in chip fabrication has many advantages, including overall reduction in cost, reduction in package volume, and enhanced electrical efficiency due to shorter signal transmission paths. Moreover, increased miniaturization has enabled the formation of complex integrated circuits on a single chip or die, such as a so-called "computer on a chip."

In general, the circuits on a chip or die terminate in conductive bond pads arrayed on the die's active surface, typically in one or more rows about the die periphery or across a central portion of the die. These bond pads are generally formed of aluminum or an aluminum alloy and are designed to be conductively connected to terminals of a carrier substrate such as an interposer or circuit board, the pattern of terminals on which may not correspond to the locations of the corresponding bond pads on the die. In addition, the lateral bond pad-to-bond pad separation (pitch) may be too close for satisfactory direct attachment to a substrate. Thus, if the conductive connection to carrier substrate terminals is to be at least in part by wire bonding, as in a dense wafer-level chip-scale package, it is difficult to achieve the desired connection without crossing of wires, undue closeness of wires, or an overly steep bonding angle, all of which may lead to a higher frequency of shorting, such as may be induced by wire sweep. Currently proposed packages have even greater numbers of bond pads packed into smaller spaces, i.e., with finer pitch.

Where a conventional package is intended to be attached in flip-chip configuration to conductive areas of an interposer or other substrate, i.e., by direct attachment with solder bumps, a redistribution layer (RDL) is currently added to the package. A conventional wafer-level semiconductor package 10 with a single RDL 20 is depicted in Prior Art FIG. 1. The package 10 comprises a semiconductor die 12 with an active surface 18 and a backside 28. The package 10 includes a plurality of conductive die bond pads 14 on the active surface 18, typically either in a peripheral arrangement or along a generally central axis. In this prior art package, a die passivation layer 16 covers the active surface 18 between the die bond pads 14 to protect and electrically insulate the active surface 18. A conventional RDL 20 comprises a metallization layer formed on the die passivation layer 16 or on one or more additional layers 26A, 26B . . . 26N of passivating material. The metallization layer is typically applied by a thin film deposition process which requires photolithography and etching to define the traces of RDL 20 therefrom. Various methods may be used for forming the under-bump metallization (UBM) 22 to which the redistribution layer (RDL) 20 is joined. Typically, a UBM 22 consists of at least an adhesion/fusion barrier layer and a wetting layer (and often an intermediate layer), in order to form a pad structure which adheres well to traces 20 and to which a solder material will be attracted, or "wet," when heated to a molten state during formation of a solder ball or bump 24. The package 10 may be inverted atop a substrate such as an interposer (not shown) and the solder balls or bumps 24 joined to conductive areas in the form of terminal pads thereon. In a complex high-pitch ball array package, two or three redistribution metallization layers may be used, with intervening passivation layers separating the metallization layers. As a result, multiple steps of passivation deposition, etching, metallization deposition and etching are required.

Variations and improvements of the basic redistribution metallization layer are described in the following references:

U.S. Pat. No. 5,554,940 of Hubacher describes a redistribution layer which, in addition to bump pads, also includes separate test pads which may be contacted with cantilever probe needles. Each test pad is situated near a respective bond pad so that the same (or similar) probe card apparatus and cantilever needles may be used to test the semiconductor device, either on the bond pads (for a wire-bonded device) or on the test pads (for a bumped device).

In U.S. Pat. No. 6,536,653 of Wang et al., a method for bumping and bonding semiconductor packages is disclosed.

U.S. Pat. No. 6,204,562 of Ho et al. reveals a multichip module (MCM) for flip-chip attachment. The package is formed of a plurality of wafer-level chip-scale dice, wherein the larger die uses a bump pad redistribution layer for joining the dice in a flip-chip manner.

In U.S. Pat. No. 6,197,613 of Kung et al., a first bump pad redistribution layer is connected to a second redistribution layer at a different level by a via plug passing through an applied insulating layer.

In U.S. Pat. No. 6,372,619 of Huang et al., a redistribution layer is connected to elevated bump pads by vias through an insulating layer.

U.S. Pat. No. 6,433,427 of Wu et al. teaches a wafer-level package having a redistribution layer in which the redistributed bump pads are underlain by two stress-buffer layers.

U.S. Pat. No. 6,277,669 of Kung et al. describes a method for making a pad redistribution layer on a wafer-level package, wherein the distributed bump pads are underlain by an elastomeric material.

U.S. Pat. No. 6,043,109 of Yang et al. describes a method for making a wafer-level two-die package utilizing a redistribution layer on the smaller of the dice and connecting the redistribution layer to the larger die by wire bonding.

In each of the above references, one or more redistribution layers are used, typically requiring multiple deposition and etching steps. Expensive masks and reticles are required. Under-bump metallization (UBM) will also be required at the redistributed bond pad locations, adding to the overall cost. Thus, the current methods of forming RDLs require many processing steps and are time consuming and expensive. In addition, for each change in die size, for example, die "shrinks," a heavy capital investment will be incurred. The actual extent of production costs has not been fully delineated because conventional RDL technology is relatively new and not yet fully developed. Further, there is substantial incompatibility between terminal pad pitch of many carrier substrates, such as module boards used to fabricate multichip modules, and solder ball pitch of dice employing conventional RDL technology. For example, terminal pad pitch may be constrained to about 0.5 mm, whereas solder ball pitch may be significantly finer, for example, about 0.1 to 0.2 mm.

In the manufacture of packages using redistribution metallization, the dice are typically packaged prior to Known Good Die (KGD) testing. Thus, it is important to achieve a very high yield in order to reduce production costs. However, in the current state of the art, the yield is known to be unacceptably low.

It would be desirable to provide a chip-scale semiconductor package with increased pitch, increased yield, fewer packaging steps, and at reduced cost.

It would also be desirable to provide a chip-scale semiconductor package which may be attached to a carrier substrate either by wire bonding or by flip-chip attachment.

It would be further desirable to provide a chip-scale semiconductor package with improved redistribution of bond pads.

It would be still further desirable to provide an improved pad redistribution method useful for chip-scale flip-chip semiconductor packages having die bond pads either along the die periphery or along a central axis across the die.

BRIEF SUMMARY OF THE INVENTION

In various exemplary embodiments of the present invention, methods are presented for fabricating semiconductor dice in a configuration which may facilitate forming semiconductor die assemblies of improved reliability with greater ease and economy. More particularly, the methods of the present invention avoid the use of one or more redistribution metallization layers for connecting die bond pads to an array of conductive bumps. The invention applies not only to assemblies including one or more dice, such as chip-scale wire-bonded packages and flip-chip packages, but may also be employed in fabricating other semiconductor die packages and assemblies.

The methods of the present invention use a layer of anisotropically conductive material, also commonly termed a "z-axis film," as an "areal redistribution pad" to which intermediate conductive bumps, balls, or other connectors may be mounted by conventional bump-forming and/or wire-bonding equipment.

An example of an anisotropically conductive material useful in the present invention is a thin polymeric film formed with a dense pattern of laterally unconnected, generally parallel, conductive transverse "columns," i.e., pins passing through the film. The conductive columns are preferably formed of a metal or metal-containing material to which a conductive ball or bump may be readily joined and retained in place. The columns are exposed on at least one surface of the film for joining of the balls or bumps thereto. An example of one such film is a polyimide film or tape containing a dense array of conductive metal columns. The columns are sufficiently laterally separated to avoid shorting.

The anisotropic film or tape is readily adhesively attached to a die passivation layer, and conductive redistribution balls or bumps may be easily formed on and attached to the anisotropic material at any locations thereon. The conductive redistribution balls or bumps are then connected to the die bond pads by the well-developed, conventional method of wire bonding. Shorting in the x- and y-axes is avoided by the construction of the anisotropic material, and shorting in the z-direction is prevented by the die passivation layer underneath the film. The conductive redistribution balls or bumps on the semiconductor die may be electrically attached to terminal pads of another substrate such as an interposer, circuit board, die, package or wafer by wire bonding or, alternatively, by flip-chip attach using another ball or bump formed thereon at the same location. This fabrication process may be accomplished with conventional equipment commonly used in the industry. As noted above, the anisotropic material acts as an "areal redistribution pad," to which conductive balls or bumps may be bonded at any location thereon. Thus, any requirement for conventional under-bump metallization technology is avoided.

The present invention also encompasses, in additional embodiments, semiconductor die assemblies and packages fabricated of the present invention as well as higher-level assemblies incorporating the present invention.

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

In the drawings, which depict exemplary embodiments of various features of the present invention.

DETAILED DESCRIPTION OF THE INVENTION

In the present invention, a redistribution of I/O contacts or terminals is achieved without forming a conventional redistribution structure having one or more redistribution layers separated by passivation layers. In the present invention, an array of conductive redistribution bumps or balls is formed on an anisotropically conductive material disposed on the package and then connected to the bond pads of the die by wire bonding. The fabrication sequence, including formation and wiring of the redistribution bumps, may be performed at the wafer level. The resulting assembly may be attached to another substrate such as an interposer, another packaged die, a wafer or a circuit board by wire bonding or, alternatively, by flip-chip bonding.

Figure 2:
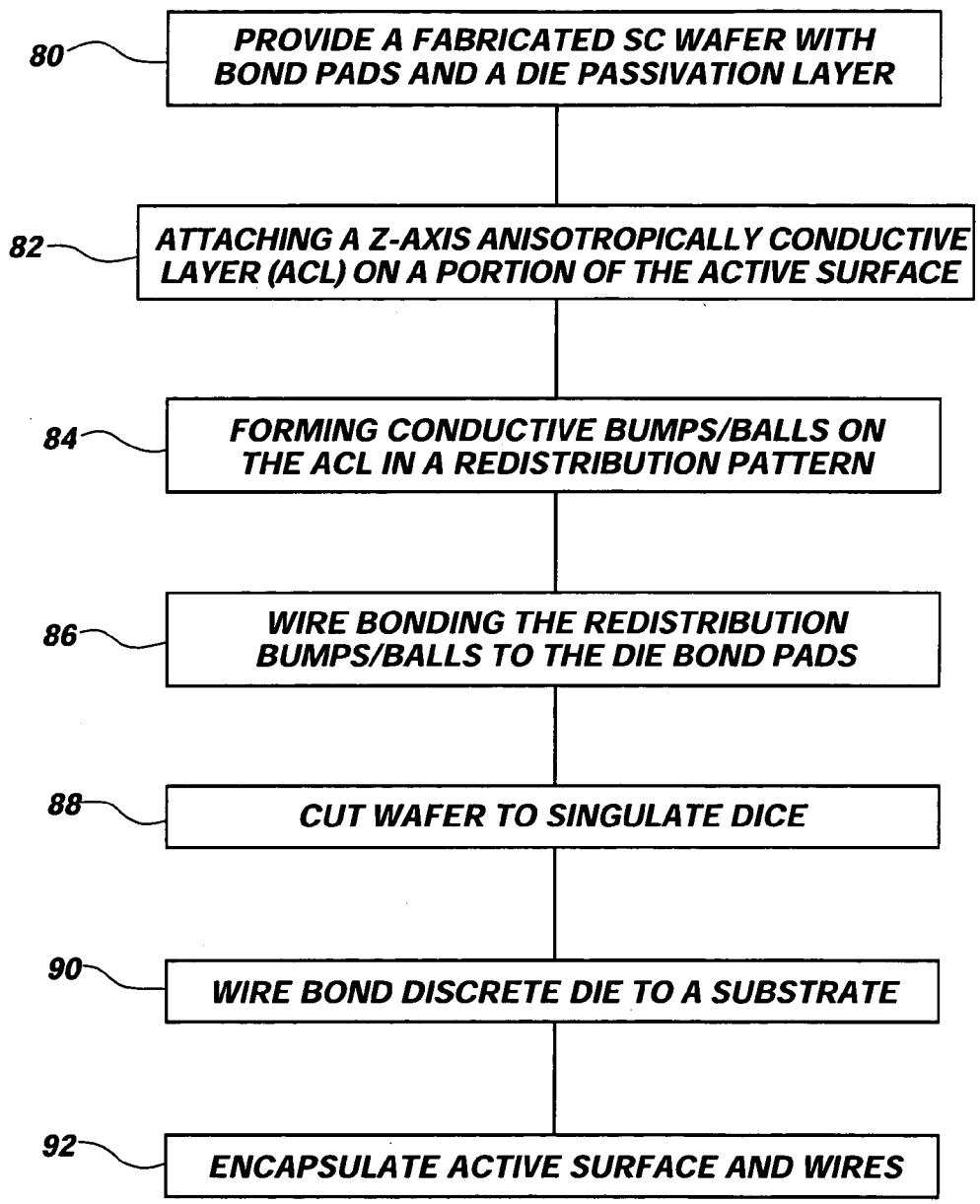
FIG. 2 is a flow chart showing the general acts used in forming a wire-bondable semiconductor package with redistribution conductive bumps of the invention.
Figure 3:
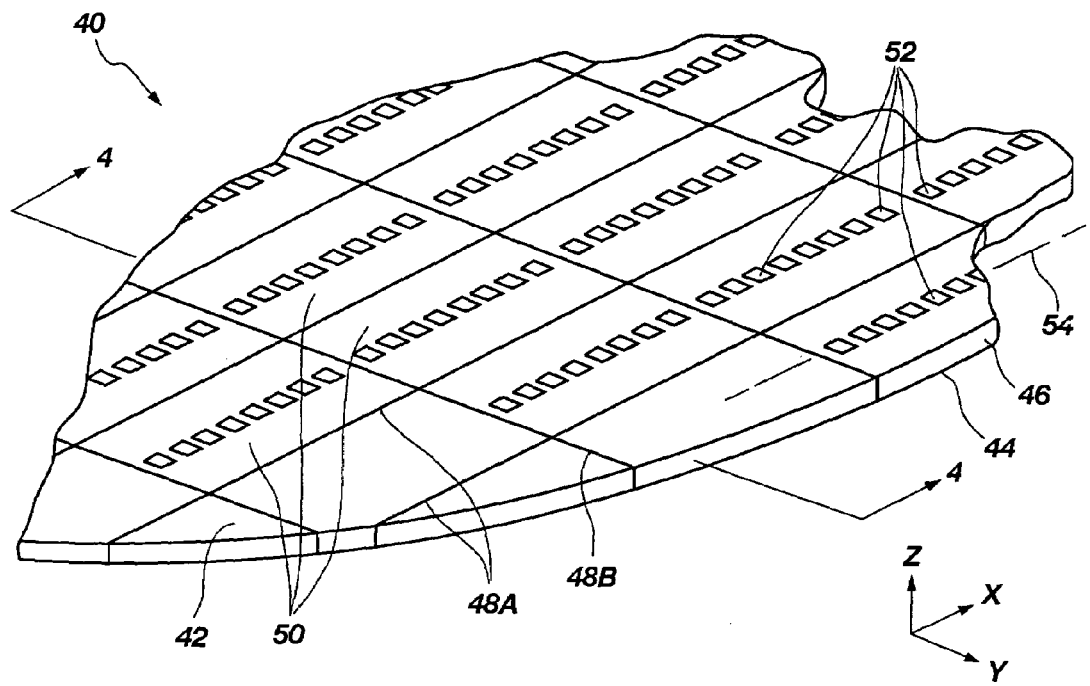
FIG. 3 is a perspective view of an exemplary semiconductor wafer of the invention comprising a plurality of fabricated dice with die bond pads.
Figure 4:
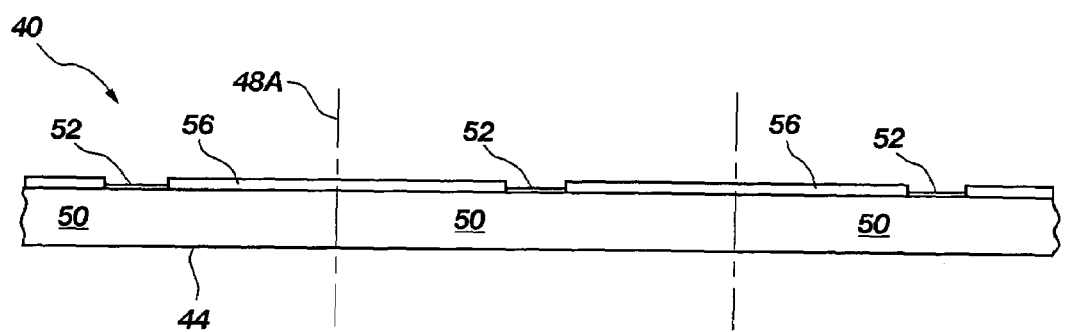
FIG. 4 is an enlarged cross-sectional edge view of a portion of an exemplary semiconductor wafer of the invention, as taken along line 4—4 of FIG. 3.

Fabrication of a wire-bondable semiconductor package of the invention may be described as performing the general acts shown in blocks in FIG. 2. Each of the acts is illustrated in one or more of FIGS. 3 through 12.

Turning now to FIG. 2, the acts in forming a wire-bondable semiconductor package 70 are numbered from 80 through 92 and include the following:

In act 80, a semiconductor wafer 40 on which is fabricated a plurality of dice 50 is provided. As used herein, the term "wafer" encompasses not only conventional silicon wafers but also other bulk substrates of semiconductive material such as gallium arsenide and indium phosphide wafers as well as silicon-on-insulator (SOI) substrates, as exemplified by silicon-on-glass (SOG) substrates and silicon-on-sapphire (SOS) substrates. Each semiconductor die 50 is fabricated with an electronic circuit in the form of an integrated circuit thereon. In an exemplary wafer of FIGS. 3 and 4, the wafer 40 has a backside 44 and an active surface 42 containing a plurality of discrete semiconductor dice 50, the portion of active surface 42 of each die 50 having a pattern of conductive bond pads 52 thereon connected to the integrated circuits thereof (not shown). The bond pads 52 are shown surrounded by a die passivation layer 56 to electrically insulate and environmentally protect the active surface 42. The edges 46 of each location of a die 50 are defined by cut lines, i.e., saw or scribe lines 48A and 48B, respectively, parallel to the x-axis and y-axis of wafer 40, respectively. In this example, bond pads 52 are arrayed along a central axis 54 of each die 50. Application of the invention to a die 50 with peripherally arrayed bond pads 52 will also be discussed subsequently.

Figure 5:
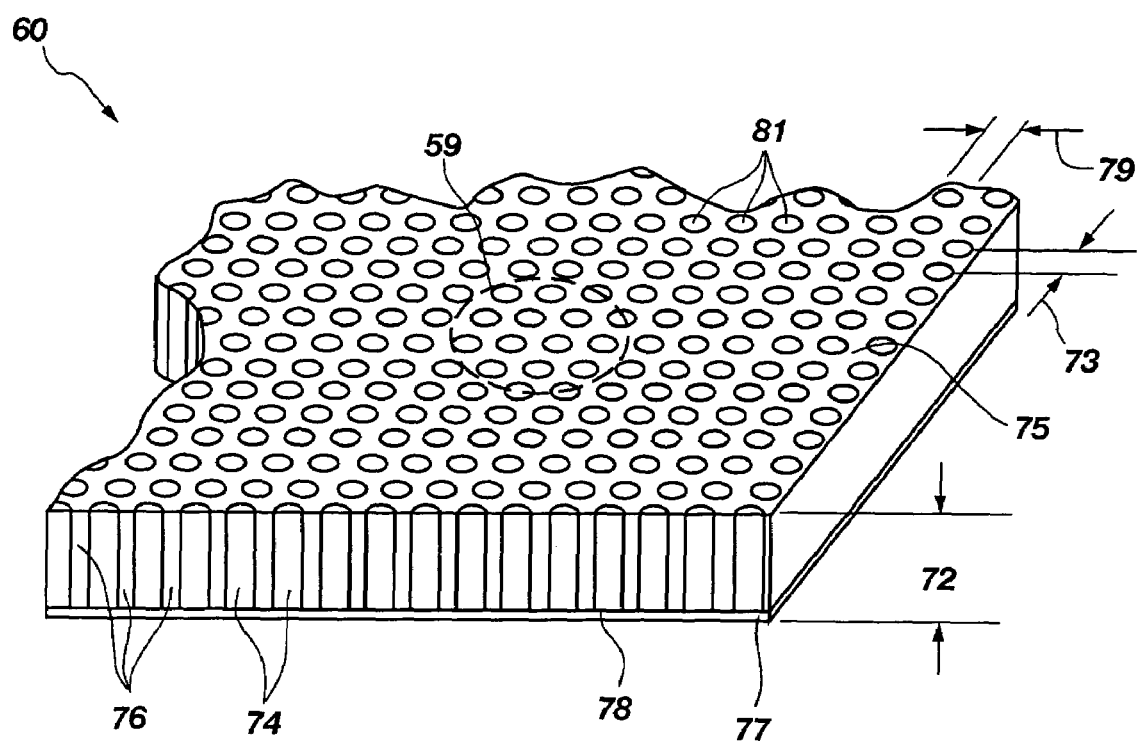
FIG. 5 is an enlarged perspective view of an exemplary anisotropically conductive (z-axis conductive) film useful in forming a semiconductor package of the invention.

The next act 82 utilizes application of an anisotropically conductive material 60, such as a commercially available film or tape illustrated in FIG. 5, to die 50. Such anisotropically conductive materials 60 are also known in the industry as z-axis tape or z-axis film and are electrically conductive in only one direction, i.e., parallel to the z-axis or vertical axis, perpendicular to the plane of the film or tape. As shown, one type of anisotropically conductive material 60 may comprise a film or tape of insulative polymer 76 of a height or thickness 72, into which a relatively dense pattern of parallel conductive metal elements 74 is embedded, generally passing through the film or tape from an upper surface 75 to a backside 77 thereof. The insulative polymer 76 is typically a dielectric material such as polyimide or other polymer. The conductive metal elements 74 may be columns formed of, for example, a metal such as tungsten, aluminum, copper, silver, gold, or alloys thereof and exposed at their upper ends 81, i.e. on the upper surface 75 of the anisotropically conductive material 60, so that conductive bumps or balls may be bonded to the columns. It is currently preferred that the columns 74 be formed of gold. The column diameter 79 may vary but, for example, may be between about 1 μm and about 15 μm. It is currently more preferred that the column diameter 79 be between about 2 μm and about 8 μm. The column diameter 79 and spacing or pitch 73 are preferably imposed so that a plurality of exposed columns 74 will be bonded to a single conductive bump or ball formed or placed thereon. In FIG. 5, the diameter 59 of the footprint of an exemplary conductive bump is shown in broken lines as at least partially contacting a dozen or more columns 74. The exposed column upper ends 81 may occupy only a small portion of the upper tape surface 75 and still effectively retain the conductive bumps or balls by metallurgical bonding thereto. The anisotropically conductive material 60 is shown in FIG. 5 with an adhesive layer 78, such as a pressure-sensitive adhesive layer on the backside 77, for adhesion to a die passivation layer 56 (see FIG. 7).

Figure 6:
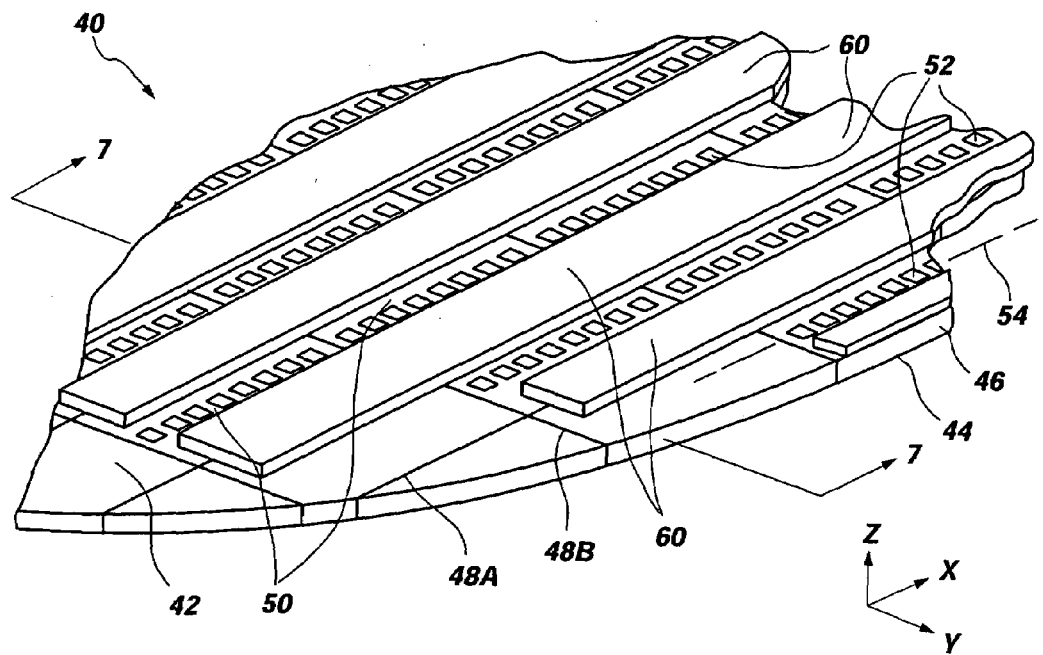
FIG. 6 is a perspective view of an exemplary semiconductor wafer upon which are attached fields of anisotropically conductive material of the invention.
Figure 7:
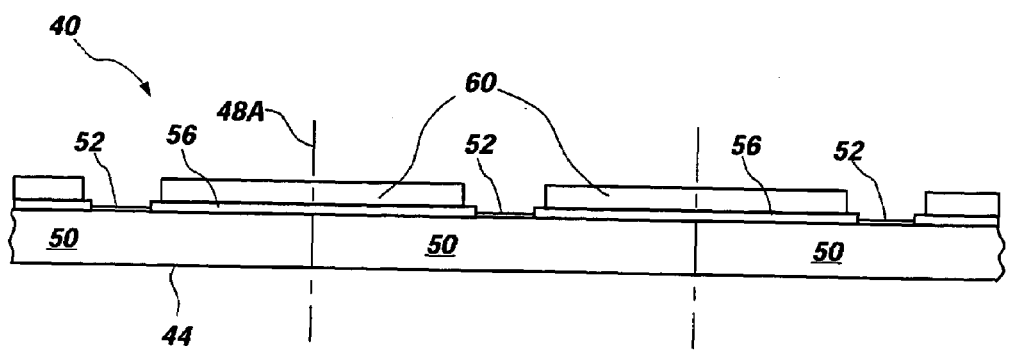
FIG. 7 is an enlarged cross-sectional edge view of a portion of an exemplary semiconductor wafer upon which are attached fields of anisotropically conductive material of the invention, as taken along line 7—7 of FIG. 6.

As depicted in FIGS. 6 and 7, the anisotropically conductive material 60 is applied in act 82 to the die passivation layer 56 between rows of bond pads 52. In the wafer stage, a single elongate strip of a film or tape of anisotropically conductive material 60 may be applied over adjacent portions of two rows of dice 50 and later cut with the underlying wafer 40 when the semiconductor dice 50 are singulated. In the event that the anisotropically conductive material of the film does not have an integral adhesive layer 78, a separately applied adhesive material may be utilized to secure the film to the dice or, alternatively, the insulative polymer may comprise a thermoplastic resin and the film of anisotropically conductive material 60 adhered to semiconductor dice 50 by a brief application of heat.

Figure 1:
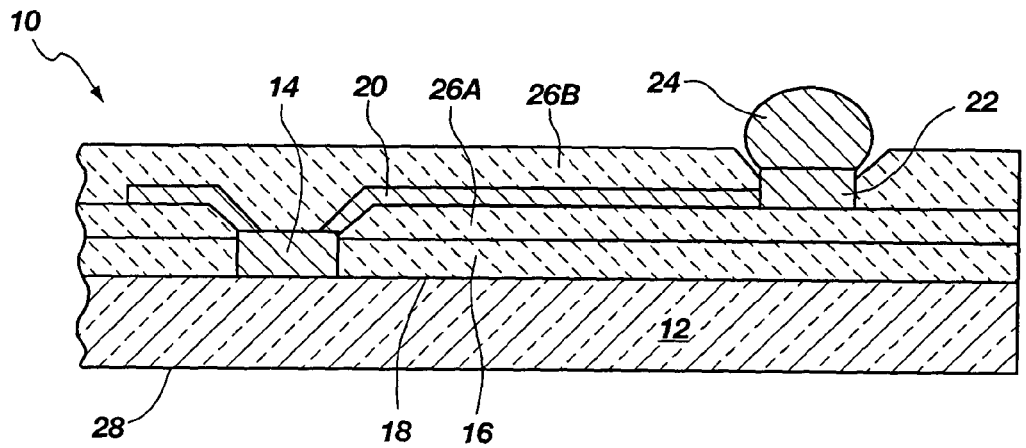
FIG. 1 is a cross-sectional view of a segment of a chip-scale semiconductor package with a conventional redistribution layer for repositioning solder bumps to match the attachment pads of an interposer.
Figure 12:
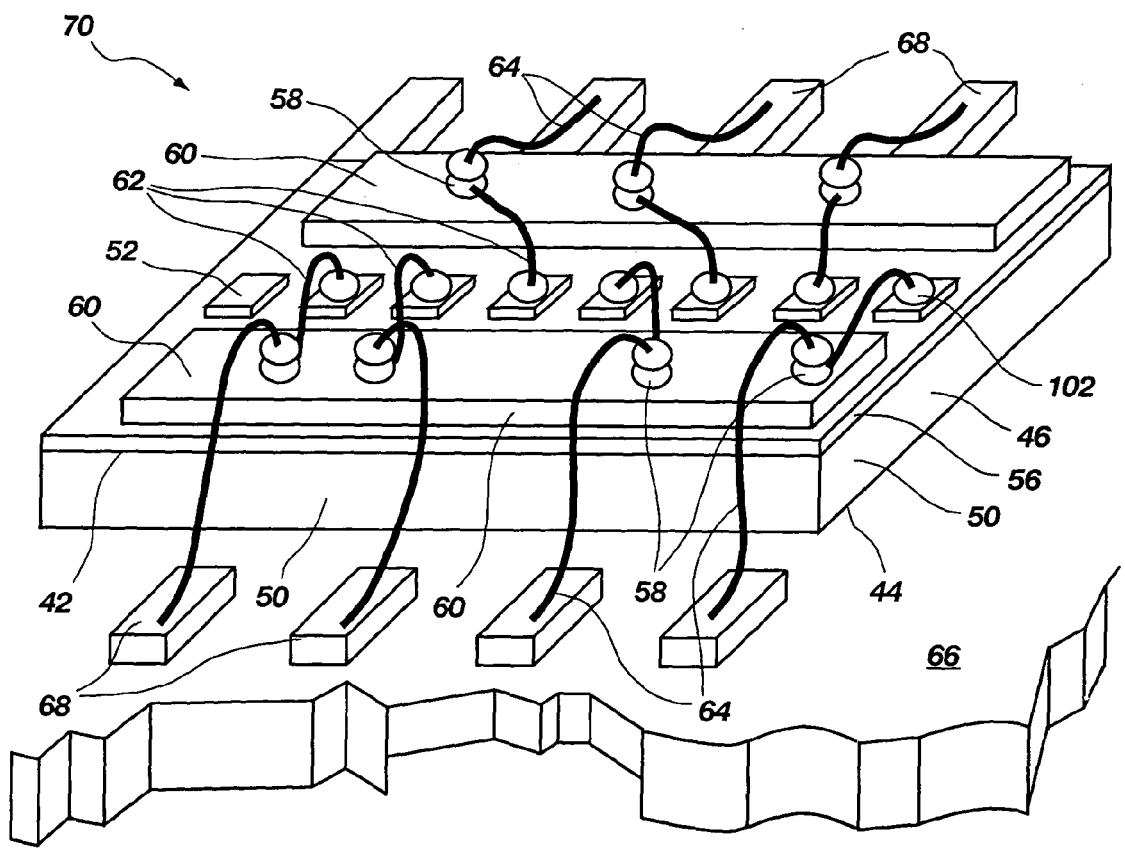
FIG. 12 is a perspective view of an exemplary semiconductor device formed of the invention and wire bonded to a carrier substrate.
Figure 8:
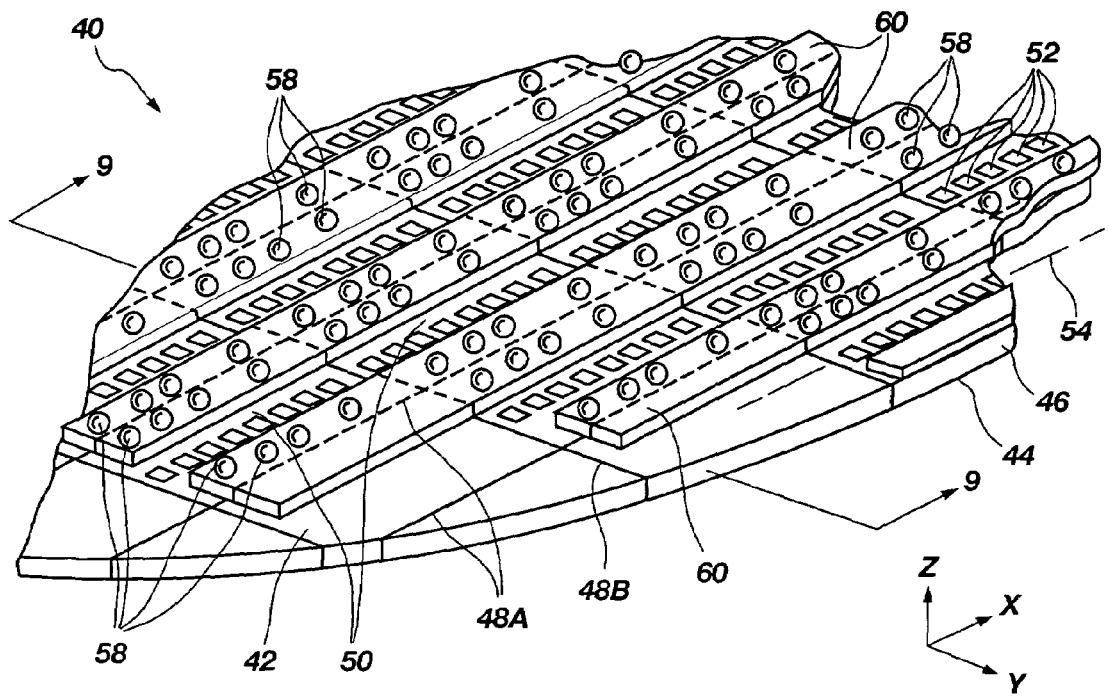
FIG. 8 is a perspective view of an exemplary semiconductor wafer upon which redistribution conductive bumps are formed on fields of anisotropically conductive material of the invention.
Figure 9:
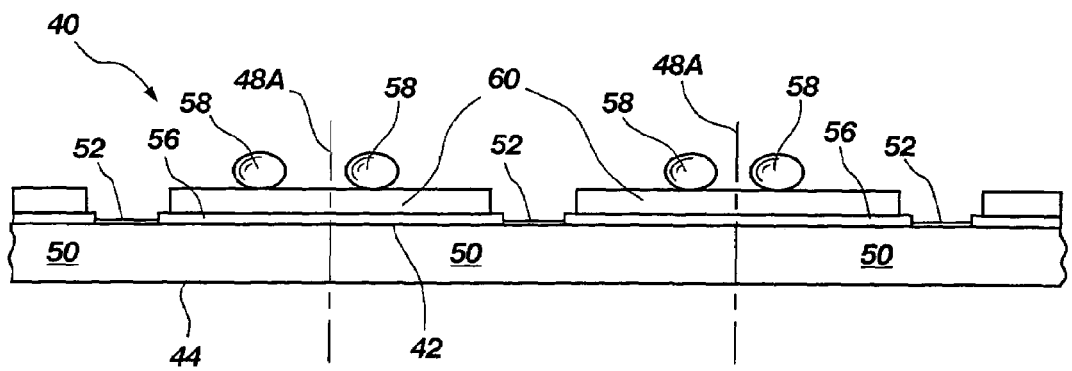
FIG. 9 is an enlarged cross-sectional view of a portion of an exemplary semiconductor wafer with redistribution conductive bumps formed on fields of anisotropically conductive material of the invention, as taken along line 9—9 of FIG. 8.
Figure 10:
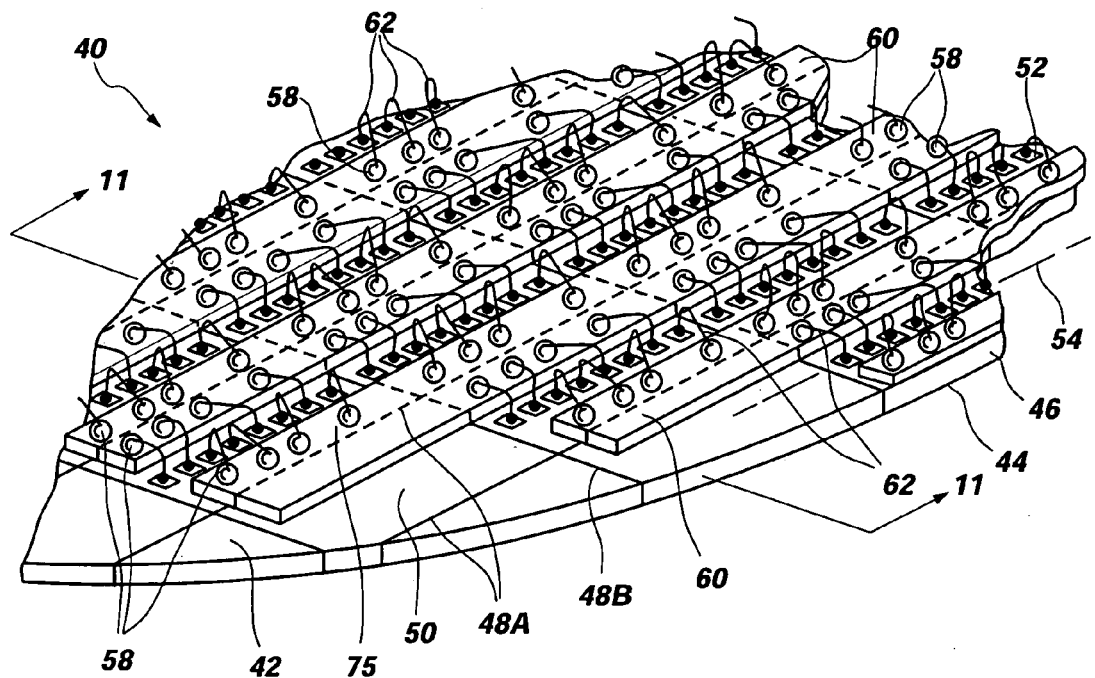
FIG. 10 is a perspective view of an exemplary semiconductor wafer with wire bonds connecting die bond pads to redistribution conductive bumps of the invention.
Figure 11:
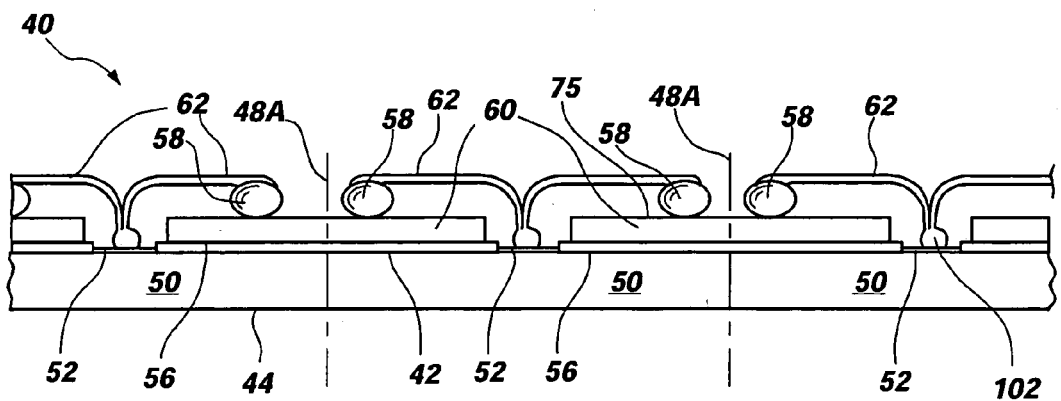
FIG. 11 is an enlarged cross-sectional view of a portion of an exemplary semiconductor wafer with wire bonds connecting die bond pads to redistribution solder bumps of the invention, taken along line 11—11 of FIG. 10.

In the next act 84, as shown in FIGS. 8 and 9, redistribution conductive balls or bumps 58 are placed on the anisotropically conductive material 60 and bonded to the exposed column upper ends 81 (not shown) by the use of heat, pressure and/or ultrasonic vibration as is practiced conventionally in the wire bonding art. The redistribution conductive balls or bumps 58 may be formed of any applicable metallurgy, and currently are preferably gold, for forming robust gold intermetallic bonds with gold columns 74 in the anisotropically conductive material 60. Bump placement may be by any applicable method which will form the balls or bumps in desired locations for subsequent joining to another substrate 66 (FIG. 12). For a wire-bondable package 70, the redistribution conductive ball or bump locations may be selected to provide high-quality, widely pitched wire bonds 62 with the bond pads 52, as shown in FIGS. 10 and 11, and simultaneously enable the subsequent formation of short, high quality wire bonds 64 with a substrate 66, as depicted in FIG. 12.

Following the placement and bonding of redistribution conductive balls or bumps 58 on the anisotropically conductive material 60, the redistribution conductive balls or bumps 58 are wire bonded in act 86 to the bond pads 52. Act 86 is illustrated in FIGS. 10 and 11. Although any wire-bonding system may be used, standoff stitch bonding (SSB) is currently preferred. An SSB machine can be used to first apply the redistribution conductive balls or bumps 58 to the upper surface 75 (see FIG. 5) of anisotropically conductive material 60, form a ball 102 on each of the bond pads 52, then loop and form a stitch bond with the redistribution conductive ball or bump 58. In addition, the SSB method may be used for final wire bonding of redistribution conductive ball or bump 58 to another substrate 66, e.g., an interposer.

The next act 88 is shown as cutting the wafer along cut lines 48A and 48B to singulate the discrete dice 50, using any of the methods well known in the industry. Optionally, a further protective layer (not shown) of insulating material may be applied over the bond pads 52 and adjacent portions of the wire bonds 62 in the wafer stage, i.e., before singulation.

In act 90, the redistribution conductive balls or bumps 58 are attached to terminal pads 68 of another substrate 66 by wire bonding. The substrate 66 may be an interposer, a wafer, a partial wafer, another semiconductor die, a circuit board or other electronic component. As illustrated in FIG. 12, a chip-scale semiconductor package 70 has been formed by the method of the invention and has been wire bonded to terminal pads 68 of substrate 66. If desired, in act 92 the assembly may be protected by application of a thermoplastic encapsulant over the semiconductor die 50, wire bonds 64 and terminal pads 68 by transfer molding, injection molding or pot molding, or by so-called "glob top" encapsulation techniques applying a viscous, flowable silicone gel or epoxy encapsulant.

It should be noted that the present invention is not limited to use with singulated semiconductor dice, but that multidie groupings, sometimes known as "partial wafers," may also benefit therefrom. For example, in still another embodiment of the invention, the conductive redistribution balls or bumps of the present invention may be used in conjunction with "jumper" bond wires connecting bond pads of adjacent dice of a partial wafer, as well as providing connections to another substrate for two or more dice along, for example, a single edge of the partial wafer.

Figure 13:
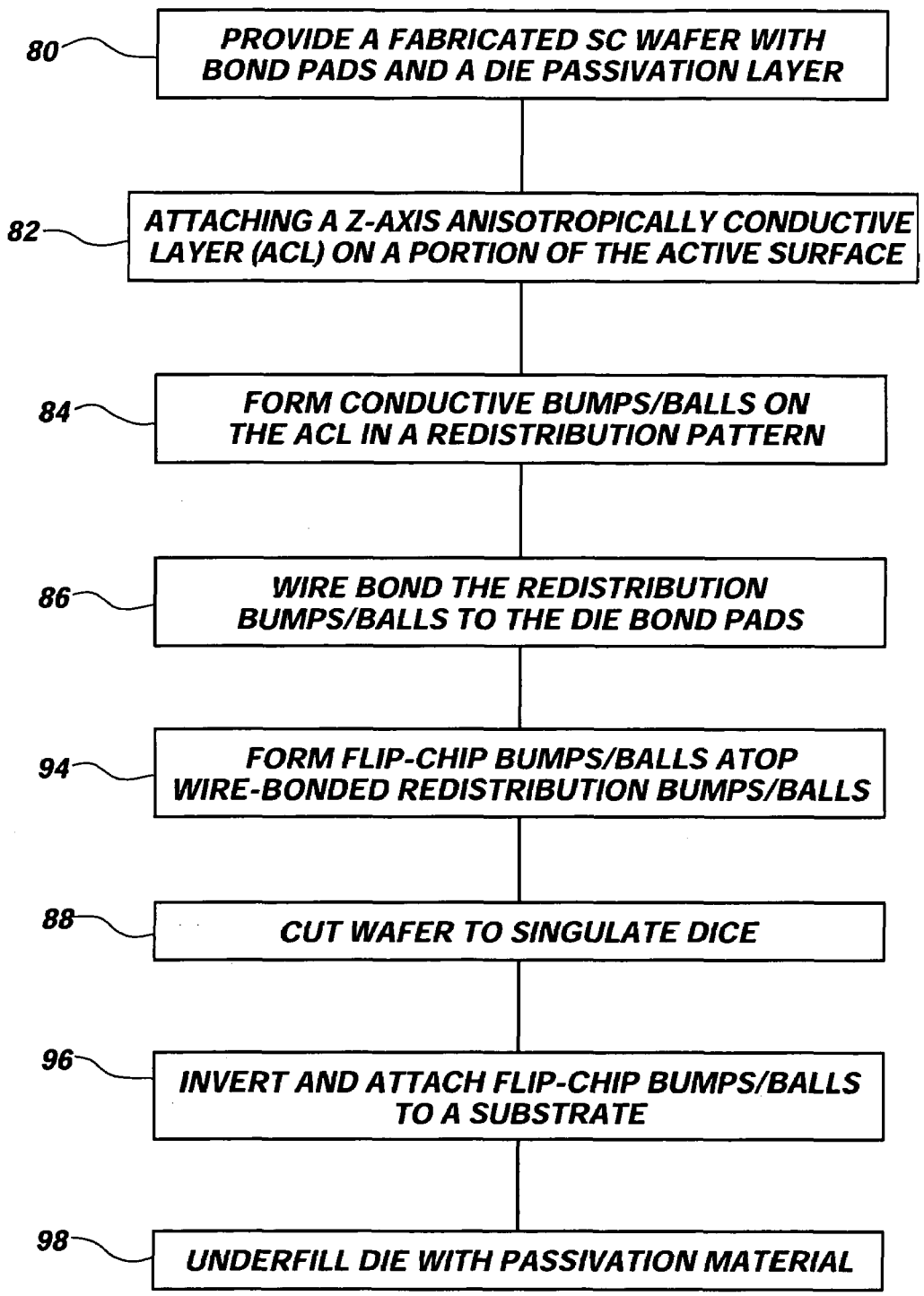
FIG. 13 is a flow chart showing the general acts of the invention used in forming a flip-chip chip-scale semiconductor package with redistribution.
Figure 14:
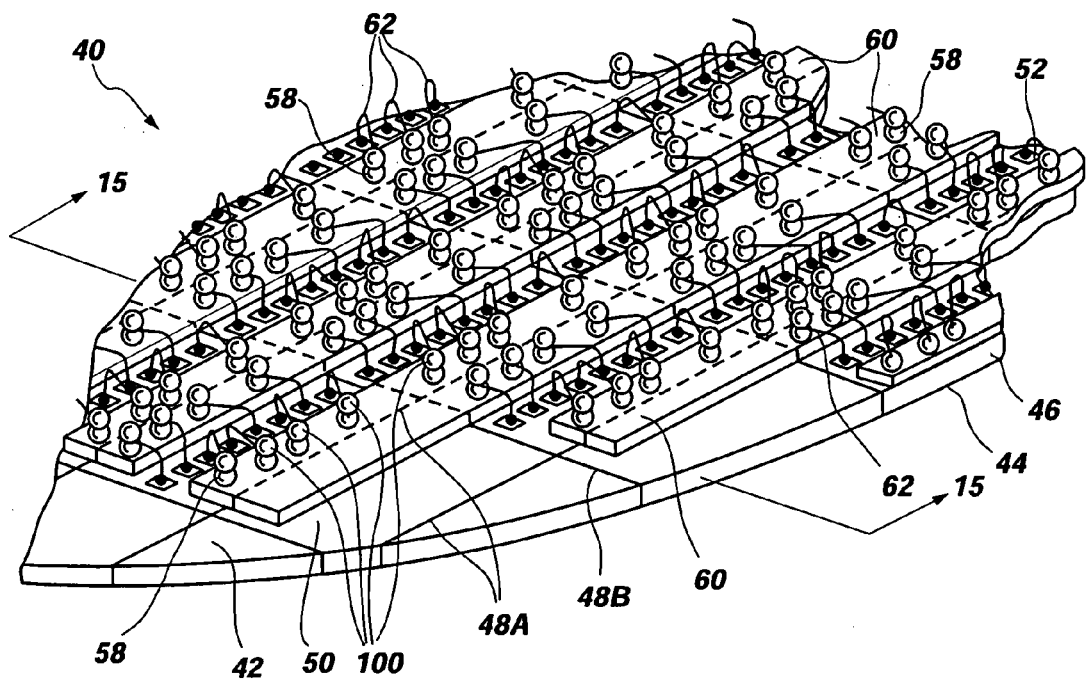
FIG. 14 is a perspective view of a portion of an exemplary semiconductor wafer of the invention with wire bonds connecting die bond pads to redistribution conductive bumps, followed by formation of flip-chip bumps atop the redistribution conductive bumps.
Figure 15:
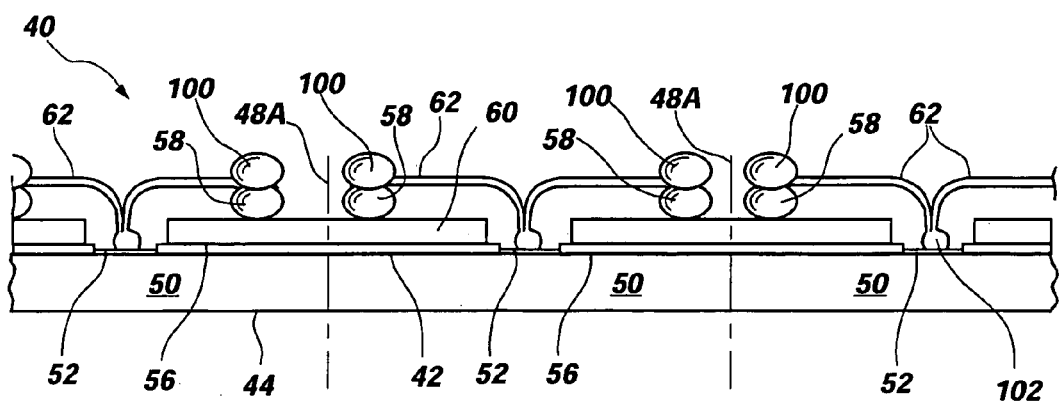
FIG. 15 is an enlarged cross-sectional view of a portion of an exemplary semiconductor wafer of the invention with wire bonds connecting die bond pads to redistribution conductive bumps, followed by formation of flip-chip bumps atop the redistribution conductive bumps, as taken along line 15—15 of FIG. 14.

The use of anisotropically conductive materials 60 is also very advantageous for flip-chip devices requiring redistribution of I/O locations for a ball grid array (BGA) configuration. The acts in forming such a semiconductor package are shown in FIG. 13, of which acts 80, 82, 84, 86, and 88 are the same as described for the wire-bondable package 70. The method of FIG. 13 differs from that of FIG. 2 in that an additional act 94 is performed to form conductive flip-chip balls or bumps 100, otherwise known as stud bumps, atop the existing conductive redistribution balls or bumps 58. This act is illustrated in FIGS. 14 and 15 as being performed at the wafer level. In this act, a ball grid array (BGA) is formed on the active surface portions of the semiconductor dice 50 of the wafer 40.

Figure 16:
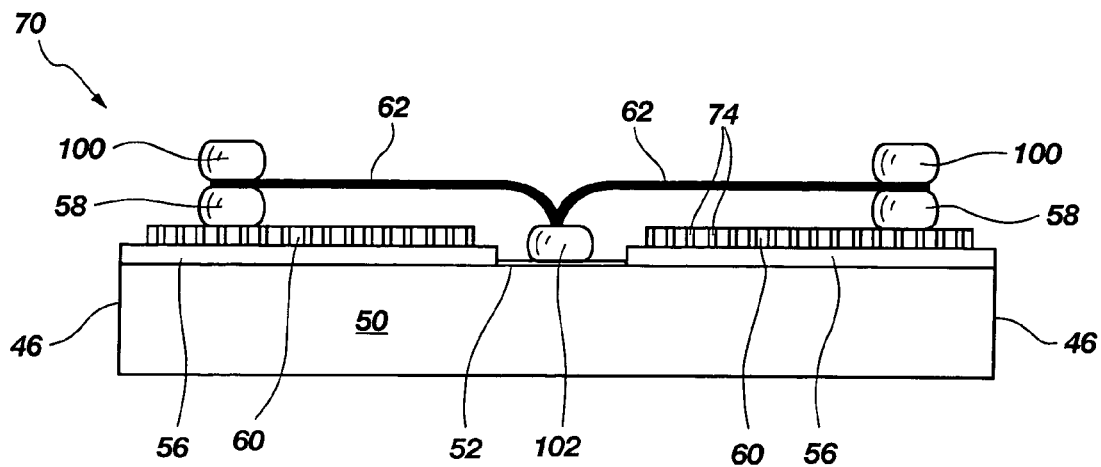
FIG. 16 is a cross-sectional view of an exemplary, singulated chip-scale semiconductor die package of the invention configured for flip-chip attachment to a carrier substrate.

The wafer 40 may then be cut along cut lines 48A and 48B to singulate the semiconductor dice 50, as shown in FIG. 16. Optionally, prior to singulation in act 88, a further dielectric layer (not shown) may be applied over portions of the active surface 42 of the wafer 40, including exposed portions of the active surface 42, bond pads 52, anisotropically conductive material 60, wire bonds 62 and redistribution conductive balls or bumps 58, leaving conductive flip-chip balls or bumps 100 projecting therefrom.

Figure 17:
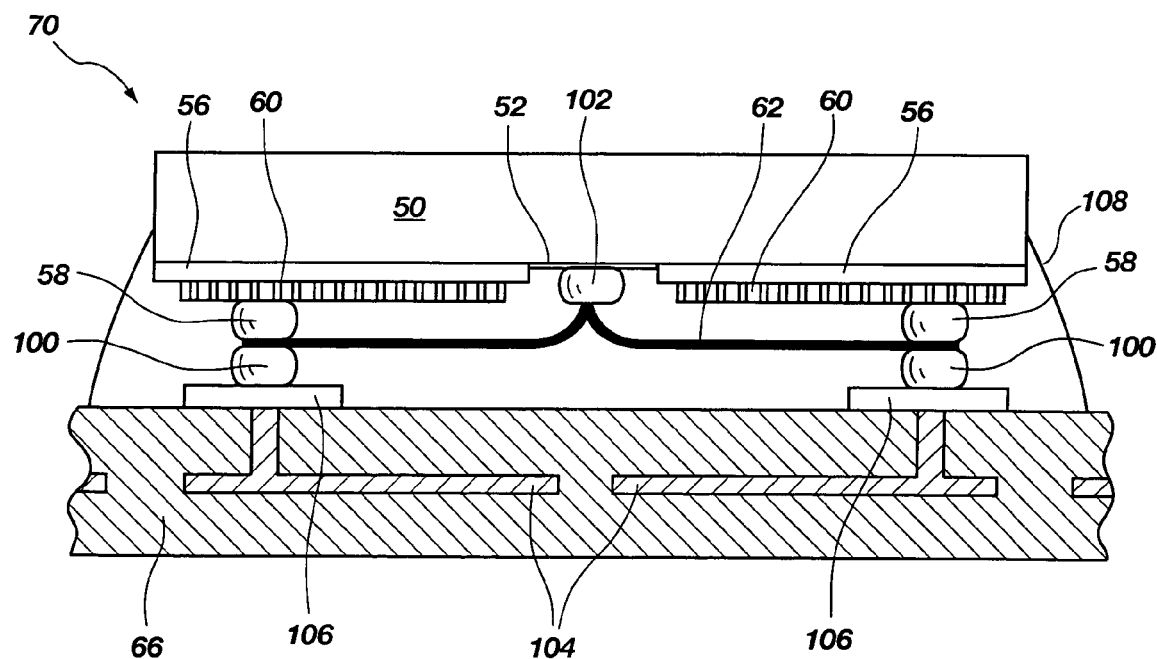
FIG. 17 is a cross-sectional view of the exemplary singulated chip-scale semiconductor die package of FIG. 16 attached by flip-chip technique to a carrier substrate and underfilled by methods of the invention.

In act 96, shown in FIG. 17, the package 70 is inverted and the flip-chip balls or bumps 100 of package 70 are attached to a mirror-image set of conductive terminal pads 106 on the substrate 66. The substrate 66 is shown as an interposer with an internal metallization layer 104 terminating in the conductive terminal pads 106 but, as before, the substrate 66 may comprise a wafer, a partial wafer, another die, a circuit board or other electronic component. In the event that the unsingulated wafer 40 is to be flip-chip bonded to a substrate 66 comprising another wafer or substrate shaped like a wafer, singulation may be performed following flip-chip attach 96.

In act 98, the package 70 may be underfilled with a passivating material 108, typically an electrically insulative, flowable polymer in gel or viscous liquid form.

The order of acts shown in FIGS. 2 and 13 need not be followed in a strictly consecutive fashion. Thus, for example, singulation may be performed earlier in the order than shown. In addition, other acts may be added as desired or required to fabricate the final semiconductor die package.

In another embodiment of the present invention generally formed according to the method of FIG. 13, an anisotropically conductive material 60 may be used to redistribute peripheral bond pads 52 in a flip-chip package 70 to a central area of the die to form an array of locations suitable for flip-chip attachment using conductive balls or bumps 100. The acts of FIG. 13 may be used to form this type of package.

In yet another application of the present invention, partial wafers comprising two or more unsingulated semiconductor dice may be flip-chip attached to another substrate of the present invention. For example, four semiconductor dice joined edge to edge in a row may be simultaneously flip-chip attached to another substrate. Such an approach may be used to fabricate, for example, a multichip memory module.

The present invention thus provides a lower cost alternative to the use of conventional redistribution layers and requires fewer process steps with the elimination of under-bump metallization. Further, the present invention also provides an effective interim solution for wafer-level packaging in which cost is still unacceptably high for low-yielding wafers and conventional wafer-level packaging technology is not yet fully commercialized.

Although the foregoing description contains many specific details, these should not be construed as limiting the scope of the present invention, but merely as providing illustrations of some exemplary embodiments. Similarly, other embodiments of the invention may be devised which do not depart from the scope of the present invention. Moreover, features from different embodiments of the present invention may be employed in combination. The scope of the invention is, therefore, indicated and limited only by the appended claims and their legal equivalents, rather than by the foregoing description. All additions, deletions, and modifications to the exemplary embodiments of the invention, as disclosed herein, which fall within the meaning and scope of the claims are embraced thereby.

What is claimed is:

1. A semiconductor substrate assembly, comprising:
    at least one semiconductor die having a plurality of bond pads formed on an active surface thereof;
    at least one anisotropically conductive layer comprising a plurality of laterally isolated conductive elements disposed in a dielectric material and having upper ends exposed therethrough attached to the active surface;
    a plurality of conductive bumps on the at least one anisotropically conductive layer with each conductive bump in contact with at least one conductive element of the plurality; and
    a plurality of wire bonds extending between the bond pads and the conductive bumps, each wire bond of the plurality having a first end directly attached to a bond pad of the plurality of bond pads and a second end directly attached to a conductive bump of the plurality of conductive bumps.

2. The assembly of claim 1, wherein the at least one anisotropically conductive layer comprises conductive elements in the form of discrete metal columns embedded in a polymeric material.

3. The assembly of claim 2, wherein the discrete metal columns have a diameter of about 1 µm to about 15 µm.

4. The assembly of claim 2, wherein the discrete metal columns have a diameter of about 2 µm to about 8 µm.

5. The assembly of claim 2, wherein the polymeric material comprises a tape or film.

6. The assembly of claim 1, wherein the conductive elements comprise at least one of tungsten, aluminum, copper, silver, gold, and alloys thereof.

7. The assembly of claim 1, wherein the at least one anisotropically conductive layer is attached to the active surface by an adhesive.

8. The assembly of claim 1, further comprising:
    a substrate having a plurality of terminal pads on a surface thereof; and
    wire bonds between the plurality of conductive bumps and the plurality of terminal pads.

9. The assembly of claim 8, wherein the substrate comprises one of a circuit board, an interposer, a semiconductor die, a wafer and a partial wafer.

10. The assembly of claim 7, further comprising a dielectric layer over the at least one semiconductor die, the bond pads, the conductive bumps and the wire bonds.

11. The assembly of claim 1, wherein the conductive bumps are attached to the conductive elements by metallurgical bonds.

12. The assembly of claim 1, wherein the conductive bumps and the wire bonds are formed of gold.

13. A semiconductor substrate assembly, comprising:
    at least one semiconductor die having a plurality of bond pads formed on an active surface thereof;
    at least one anisotropically conductive layer comprising a plurality of laterally isolated conductive elements disposed in a dielectric material and having upper ends exposed therethrough attached to the active surface; and
    a plurality of conductive bumps on the at least one anisotropically conductive layer with each conductive bump in contact with at least one conductive element of the plurality;
    wire bonds between the bond pads and the conductive bumps;
    wherein the at least one semiconductor die has the plurality of bond pads centrally located along an axis thereof and the at least one anisotropically conductive layer comprises a plurality of anisotropically conductive layers adjacent the plurality of bond pads on opposing sides thereof; and
    wherein the at least one semiconductor die comprises a wafer including a plurality of semiconductor dice, and the plurality of anisotropically conductive layers are disposed between pluralities of bond pads of adjacent semiconductor dice and extending over boundaries therebetween.

14. The assembly of claim 1, wherein the at least one semiconductor die is in the form of a singulated die, a partial wafer comprising a plurality of semiconductor dice or a wafer comprising a plurality of semiconductor dice.

15. A semiconductor substrate assembly, comprising:
    at least one semiconductor die having a plurality of bond pads formed on an active surface thereof;
    at least one anisotropically conductive layer comprising a plurality of laterally isolated conductive elements disposed in a dielectric material and having upper ends exposed therethrough attached to the active surface;
    a plurality of conductive bumps on the at least one anisotropically conductive layer with each conductive bump in contact with at least one conductive element of the plurality;
    wire bonds between the bond pads and the conductive bumps; and
    another plurality of conductive bumps, each conductive bump of the another plurality disposed on one of the plurality of conductive bumps.

16. The assembly of claim 15, further comprising:
    a substrate having a plurality of terminal pads on a surface thereof with the conductive bumps of the another plurality in alignment with and bonded to the terminal pads.

17. The assembly of claim 16, wherein the substrate comprises one of a circuit board, an interposer, a semiconductor die, a wafer and a partial wafer.

18. The assembly of claim 17, wherein the at least one semiconductor die comprises a wafer including a plurality of semiconductor dice and the substrate comprises a wafer-scale substrate.

19. The assembly of claim 16, further comprising a dielectric underfill material between the at least one semiconductor die and the substrate.

20. The assembly of claim 15, further comprising a dielectric material covering the plurality of conductive bumps, the bond pads and the wire bonds therebetween and leaving at least a portion of each of the conductive bumps of the another plurality exposed therethrough.

* * * * *

UNITED STATES PATENT AND TRADEMARK OFFICE
CERTIFICATE OF CORRECTION

PATENT NO. : 7,105,930 B2  
APPLICATION NO. : 10/634123  
DATED : September 12, 2006  
INVENTOR(S) : Lua et al.

It is certified that error appears in the above-identified patent and that said Letters Patent is hereby corrected as shown below:

On the title page, item (54), in "Title", in column 1, lines 4–5, after "FILM" delete ", METHODS OF FABRICATION".

On the title page, item (56), under "U.S. Patent Documents", in column 2, line 1, delete "8,043,109" and insert -- 6,043,109 --, therefor.

On the title page, item (56), under "U.S. Patent Documents", in column 2, line 4, delete "8,197,813" and insert -- 6,197,613 --, therefor.

On the title page, item (56), under "U.S. Patent Documents", in column 2, line 10, delete "6,806,560 B1" and insert -- 6,806,560 B2 --, therefor.

In column 1, lines 4–5, after "FILM" delete ", METHODS OF FABRICATION".

In column 9, line 49, in Claim 8, after "bonds" insert -- extending --.

Signed and Sealed this

Eighth Day of April, 2008

JON W. DUDAS  
*Director of the United States Patent and Trademark Office*